United States Patent
Kinoshita (10) Patent No.: US 12,129,571 B2
(45) Date of Patent: Oct. 29, 2024

(54) SILICON CARBIDE SINGLE CRYSTAL AND SEMICONDUCTOR APPARATUS

(71) Applicant: Mitsubishi Electric Corporation, Tokyo (JP)

(72) Inventor: Hiroyuki Kinoshita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 488 days.

(21) Appl. No.: 17/432,087

(22) PCT Filed: Jun. 18, 2020

(86) PCT No.: PCT/JP2020/024013
§ 371 (c)(1),
(2) Date: Aug. 18, 2021

(87) PCT Pub. No.: WO2020/256073
PCT Pub. Date: Dec. 24, 2020

(65) Prior Publication Data
US 2022/0195622 A1 Jun. 23, 2022

(51) Int. Cl.
*C30B 29/36* (2006.01)
*H01L 29/16* (2006.01)
(Continued)

(52) U.S. Cl.
CPC .......... *C30B 29/36* (2013.01); *H01L 29/1608* (2013.01); *H01L 29/778* (2013.01); *H01L 29/812* (2013.01)

(58) Field of Classification Search
CPC ....... C30B 29/36; H01L 29/04; H01L 29/167; H01L 29/1608; H01L 29/2003;
(Continued)

(56) References Cited

U.S. PATENT DOCUMENTS 5,736,753 A * 4/1998 Ohno .................. H01L 29/7813
257/481
6,218,680 B1 4/2001 Carter, Jr. et al.
(Continued)

FOREIGN PATENT DOCUMENTS

CN 1985029 A 6/2007
JP H9-301799 A 11/1997
(Continued)

OTHER PUBLICATIONS

An Office Action mailed by China National Intellectual Property Administration on Jan. 9, 2024, which corresponds to Chinese Patent Application No. 202080038374.6 and is related to U.S. Appl. No. 17/432,087; with English language translation.
(Continued)

*Primary Examiner* — Chad M Dicke
*Assistant Examiner* — Mario Andres Autore, Jr.
(74) *Attorney, Agent, or Firm* — Studebaker & Brackett PC (57) ABSTRACT

A silicon carbide single crystal has a positive correlation between a temperature and an electric resistivity in a range from room temperature to 400° C., has an electric resistivity of at least $1\times10^7$ $\Omega\cdot$cm in the range from room temperature to 400° C., exhibits electric conduction by holes while no significant electric conduction properties by electrons are observed regarding electric conduction at room temperature, and has a concentration of a transition element of $1\times10^{17}/$cm$^3$ or less.

22 Claims, 4 Drawing Sheets

(51) Int. Cl.
*H01L 29/778* (2006.01)
*H01L 29/812* (2006.01)

(58) Field of Classification Search
CPC ........... H01L 29/7786; H01L 21/02378; H01L 21/02447; H01L 21/02529; H01L 21/0445–047
See application file for complete search history.

(56) References Cited

U.S. PATENT DOCUMENTS

| | | | |
|---|---|---|---|
| 9,515,145 B2* | 12/2016 | Furuhashi | ............... H01L 29/78 |
| 2003/0006415 A1* | 1/2003 | Yokogawa | ............ H01L 29/812 |
| | | | 257/532 |
| 2003/0079676 A1* | 5/2003 | Ellison | .................... C30B 29/36 |
| | | | 257/E21.054 |
| 2003/0233975 A1 | 12/2003 | Jenny et al. | |
| 2005/0006716 A1 | 1/2005 | Kumar et al. | |
| 2005/0022724 A1 | 2/2005 | Malta et al. | |
| 2005/0022727 A1 | 2/2005 | Fechko et al. | |
| 2006/0091402 A1* | 5/2006 | Shiomi | ................... C30B 29/36 |
| | | | 257/77 |
| 2008/0190355 A1 | 8/2008 | Chen et al. | |
| 2008/0265260 A1* | 10/2008 | Kitabatake | .......... H01L 29/7828 |
| | | | 257/77 |
| 2011/0297893 A1* | 12/2011 | Seki | ........................ C30B 15/02 |
| | | | 252/512 |
| 2013/0171403 A1* | 7/2013 | Straubinger | ............ C30B 29/36 |
| | | | 117/106 |

FOREIGN PATENT DOCUMENTS

| | | |
|---|---|---|
| JP | 2002-359256 A | 12/2002 |
| JP | 2004-247496 A | 9/2004 |
| JP | 2005-508821 A | 4/2005 |
| JP | 2008-504203 A | 2/2008 |
| JP | 2008-505833 A | 2/2008 |
| JP | 2012-028579 A | 2/2012 |
| JP | 2019-091873 A | 6/2019 |

OTHER PUBLICATIONS

International Search Report; Written Opinion; and Notification of Transmittal of the International Search Report and the Written Opinion of the International Searching Authority, or the Declaration issued in PCT/JP2020/024013; mailed Sep. 24, 2020.

An Office Action; "Notice of Reasons for Refusal", mailed by the Japanese Patent Office on Feb. 25, 2020, which corresponds to Japanese Patent Application No. 2019-566382; with English language translation.

An Office Action; "Decision of Refusal", mailed by the Japanese Patent Office on May 26, 2020, which corresponds to Japanese Patent Application No. 2019-566382; with English language translation.

* cited by examiner

SILICON CARBIDE SINGLE CRYSTAL AND SEMICONDUCTOR APPARATUS

FIELD

The present disclosure relates to a silicon carbide single crystal and a semiconductor apparatus using the same.

BACKGROUND

Nitride semiconductors such as GaN, MN, and InN or materials as their mixed crystals each has a wide band gap and used as a high-output electronic device, a short-wavelength light emitting device, or the like. Of these, for a high-output electronic device, techniques relating to a field effect transistor (FET) and particularly a high electron mobility transistor (HEMT) have been developed. The HEMT including the nitride semiconductor can be used for a high-output and high-efficiency amplifier, a high-power switching device, or the like, and its operation frequency can cover a microwave region or a millimeter wave region. Patent Literature 1 discloses an example of a high-output electronic device used in an amplifier for a mobile phone base station.

Silicon carbide single crystals grown by almost all of the techniques are generally too high in conductivity to be used as a substrate of a nitride semiconductor HEMT. In particular, such a high conductivity of a silicon carbide single crystal may interfere with a high-speed operation of a transistor. Thus, a silicon carbide single crystal having a high electric resistivity is required.

To realize a stable high-speed operation and high-frequency operation in a device produced on a substrate of a silicon carbide single crystal, a silicon carbide single crystal having an electric resistivity of at least $1 \times 10^5$ Ω·cm is needed as a measure against a parasitic capacitance. To minimize a transmission line loss of the device to a permissible level of 0.1 db/cm or less, a resistivity of $1 \times 10^7$ Ω·cm or more is required. Further preferably, the electric resistivity of the silicon carbide single crystal needs to approximate a range of $1 \times 10^8$ Ω·cm or more.

An example of a method of realizing a silicon carbide single crystal having a high electric resistivity is a method of simply reducing the concentration of impurities in consideration of a wide band gap of the silicon carbide single crystal. For example, a 4H silicon carbide single crystal at 300 K has a wide band gap of 3.2 eV. Thus, when the 4H silicon carbide single crystal is highly purified, its electric resistivity is increased. As another realization method, a method using V (vanadium) doping has been proposed. An example of still another realization method is also a method using a crystal defect.

CITATION LIST

Patent Literature

[PTL 1] JP 2002-359256 A

SUMMARY

Technical Problem

As previously described, when the purity of a silicon carbide single crystal is increased, the electric resistivity of the silicon carbide single crystal can be increased. However, when the silicon carbide single crystal grows, a small amount of nitrogen may often be unintentionally mixed into the silicon carbide single crystal, and the concentration of the nitrogen may reach $5 \times 10^{16}/cm^3$. When a material is highly purified, or an apparatus is always subjected to a high degree of adjustment, the concentration of the nitrogen can be set to $1 \times 10^{16}/cm^3$ or less. However, this causes a rise in cost of the silicon carbide single crystal. Further, even in the silicon carbide single crystal thus highly purified, a small amount of nitrogen that remains in the silicon carbide single crystal acts as a donor, and the activation rate of the nitrogen increases with an increase in temperature. Accordingly, the electric resistivity of the silicon carbide single crystal decreases with an increase in temperature, resulting in an undesirable change in properties of a device produced on a substrate of the silicon carbide single crystal such as a decrease in high-speed and high-frequency operation properties. The nitrogen as the donor causes excitation of carriers by radiation or light, for example, in addition to an increase in temperature, which may cause the electric resistivity of the silicon carbide single crystal to decrease.

An example of another method of increasing the electric resistivity of a silicon carbide single crystal is a method of capturing electrons contributing to electric conduction by doping of a transition element, as described above. In a method of realizing high electrical properties by capturing electrons by V, for example, a significantly high electric resistivity can be realized even when the concentrations of nitrogen, described above, and other impurities each acting as a donor are high. However, this method has a disadvantage, as will be described below, because carriers activated by impurities or a crystal defect at room temperature or by an increase in temperature are temporarily captured by V, thereby preventing movement of the carriers to realize a high electric resistivity.

As a first disadvantage, an emission time period of the carriers captured by V exponentially decreases with an increase in temperature. Thus, it is not practically effective to capture the electrons at high temperature. Accordingly, an electric resistivity is dramatically decreased at high temperature as compared with that at ordinary temperature. Accordingly, the electric resistivity of the silicon carbide single crystal, which is high enough at ordinary temperature and is high enough to be considered to be almost semi-insulating, decreases at high temperature. Therefore, when a transistor is produced on a substrate of the silicon carbide single crystal, a parasitic capacitance between the transistor and the substrate increases. As a result, a capacitance between a gate and a drain-source of the transistor increases. Thus, there is a significant problem that an output power of the transistor produced on the substrate of the silicon carbide single crystal decreases at high temperature. Even when the electric resistivity is made high by capturing the carriers with the crystal defect, this problem may occur based on the same principle.

As a second disadvantage, the electrons are temporarily captured by V. Thus, there is a problem that a potential of the substrate changes after an elapse of a predetermined time period since the electrons are captured so that properties of the transistor change.

When the transistor produced on the substrate of the silicon carbide single crystal is subjected to an on/off operation, a negative potential is applied to the gate of the transistor at an off time. Thus, free carriers are trapped at a trap level produced by V. The substrate is negatively charged (charged up) due to this phenomenon. Thus, a relative potential of the substrate varies and acts in a direction in which a depletion layer of the gate is widened, to decrease a current flowing through the transistor.

When the on/off operation is then terminated, the negative potential that has been applied to the gate at the off time disappears. However, the free carriers are temporarily captured by V, as described above. Thus, the free carriers are gradually emitted with an elapse of a time period since the on/off operation was terminated, and a substrate potential also changes. Therefore, when the on/off operation is resumed, a state of the depletion layer of the gate differs from that immediately before the on/off operation was terminated. Thus, the current flowing through the transistor changes so that properties of the transistor change.

The present disclosure has been made to solve the above-described problems, and is directed to providing a silicon carbide single crystal having a high electric resistivity at room temperature and capable of restraining a decrease in electric resistivity with an increase in temperature and restraining a temporal change of a potential of a substrate.

Solution to Problem

A silicon carbide single crystal according to the disclosure of the present application has a positive correlation between a temperature and an electric resistivity in a range from room temperature to 400° C., has an electric resistivity of at least $1 \times 10^7$ Ω·cm in the range from room temperature to 400° C., exhibits electric conduction by holes at room temperature, and having a concentration of a transition element of $1 \times 10^{17}/cm^3$ or less.

Other features of the disclosure are clarified below.

Advantageous Effects of Invention

According to the present disclosure, there can be provided a silicon carbide single crystal having a high electric resistivity and capable of restraining a decrease in electric resistivity by an increase in temperature and restraining a temporal change of a potential of a substrate because a dopant is introduced to exhibit electric conduction by holes at room temperature while restraining the concentration of a transition element.

DESCRIPTION OF EMBODIMENTS

A silicon carbide single crystal and a semiconductor apparatus according to an embodiment are described with reference to drawings. Identical or corresponding constitutional elements are given the same reference numerals, and the repeated description of such constitutional elements may be omitted.

Embodiment

A polytype of a silicon carbide single crystal according to an embodiment is 4H, for example. The silicon carbide single crystal according to the embodiment contains nitrogen, for example, as a donor dopant. The concentration of nitrogen can be in a range from $1 \times 10^{15}/cm^3$ to $5 \times 10^{16}/cm^3$. According to another example, the concentration of nitrogen can be in a range from $1 \times 10^{15}/cm^3$ to $3 \times 10^{16}/cm^3$. According to still another example, the concentration of nitrogen can be in a range from $1 \times 10^{15}/cm^3$ to $1 \times 10^{16}/cm^3$. The donor dopant can be nitrogen or silicon having a concentration of $5 \times 10^{16}/cm^3$ or less, or can be nitrogen or silicon having a concentration of less than $1 \times 10^{17}/cm^3$.

The silicon carbide single crystal according to the present embodiment is of a P type into which an acceptor is doped, and has an electric resistivity in a range of a specific resistance of at least $1 \times 10^7$ Ω·cm at room temperature. The concentration of an acceptor dopant assumed to be boron is in a range from $2 \times 10^{15}/cm^3$ to $1 \times 10^{17}/cm^3$. When the dopant concentration exceeds $1 \times 10^{17}/cm^3$, a conduction mechanism by holes becomes significant, the resistivity excessively decreases to affect electrical properties of the crystal at room temperature. Thus, the dopant concentration needs to be $1 \times 10^{17}/cm^3$ or less. According to another example, the concentration of the acceptor dopant can be in a range from $2 \times 10^{15}/cm^3$ to $5 \times 10^{16}/cm^3$. In still another example, the concentration of the acceptor dopant is in a range from $2 \times 10^{15}/cm^3$ to $3 \times 10^{16}/cm^3$. As the acceptor dopant, aluminum, zinc, magnesium, or another acceptor-type dopant can also be used in addition to boron. Needless to say, the above-described concentration of the acceptor dopant is increased or decreased depending on the activation rate of the dopant. When the acceptor dopant is aluminum, for example, a large amount of doping, the amount of which is several times that when the acceptor dopant is boron, is required. That is, the acceptor dopant can be boron or aluminum, for example, having a concentration of $1 \times 10^{17}/cm^3$ or less.

Thus, the silicon carbide single crystal according to the embodiment includes at least one type of donor dopant and at least one type of acceptor dopant. A balance between a donor and an acceptor is adjusted to a range in which conduction properties by electrons are not seen at room temperature. In other words, the silicon carbide single crystal according to the embodiment exhibits electric conduction by holes because the donor is compensated for at room temperature.

More preferably, an upper limit of the concentration of the acceptor dopant is set to $3 \times 10^{16}/cm^3$ or less, and the donor dopant capable of maintaining the p type is added.

This is due to the following reason. Examples of a method of causing a SiC substrate to be of a p type and have a high resistance include a method of performing conduction control only by a donor dopant having a low concentration and a method of compensating for acceptor carriers by a donor.

In the former method, i.e., the method of significantly reducing the respective concentrations of both the donor and the acceptor, high-resistance SiC can be easily obtained. However, a conductivity type (p/n) is difficult to control. In addition, even if the conductivity type can be controlled to a p type, the presence of an appropriate amount of donor dopant is required for the resistivity of the SiC to take a positive correlation with a temperature. Thus, the concentration of the donor dopant is further difficult to control.

In the latter method, i.e., the method of compensating for the acceptor carriers by a donor dopant, to first maintain a p type and further realize an increase in resistance, respective amounts of addition of the donor dopant and an acceptor dopant need to be accurately controlled, and the effective acceptor carriers need to have a significantly low concentration. It is highly difficult in actual production to satisfy these conditions in a state where the concentration of a donor and an acceptor is high.

A method of solving the problems is to make the concentration of the acceptor dopant as low as possible and make a doping amount controllable. Specifically, the concentration of the acceptor dopant is very preferably in a range of not less than $5 \times 10^{15}/cm^3$ nor more than $3 \times 10^{16}/cm^3$, which is an actual solving method to reduce a degree of difficulty in production. Simultaneously, considering a difference between the respective activation rates of the acceptor dopant and the donor dopant, the concentration of the donor dopant is very preferably in a range of not less than one-tenth nor more than four-tenths of the concentration of the acceptor dopant.

In the silicon carbide single crystal according to the embodiment, the electric resistivity is not controlled depending on a deep level. Therefore, from this viewpoint, the concentration of a transition element such as vanadium need not be particularly limited. However, to avoid an adverse effect of the deep level on delay properties, an upper limit of the concentration of the transition element is to be limited. If the transition element is V, for example, the concentration of V is desirably set to less than $1 \times 10^{17}/cm^3$. When the transition element is Ni or Ti, for example, other than V, the concentration of the transition element is desirably set to $1 \times 10^{16}/cm^3$ or less or set to $1 \times 10^{17}/cm^3$ or less.

The silicon carbide single crystal according to the embodiment has an electric resistivity of at least $1 \times 10^7$ Ω·cm in a range from room temperature to 400° C. According to another example, the silicon carbide single crystal has an electric resistivity of at least 10000 Ω·cm in a range from room temperature to 400° C. According to still another example, the silicon carbide single crystal has an electric resistivity of at least $1 \times 10^8$ Ω·cm in a range from room temperature to 400° C. In either one of the examples, the electric resistivity of the silicon carbide single crystal according to the embodiment increases with an increase in temperature in the range from room temperature to 400° C. This is because, in this temperature range, the electric resistivity is increased by a decrease in the number of carriers contributing to electric conduction with an increase in temperature.

The electric resistivity value of the silicon carbide single crystal was measured as follows. First, p/n determination of conduction properties was performed. A sample was prepared by evaporating two TiAl electrodes each having a diameter of 2 millimeters to a silicon carbide single crystal that was determined to be of a p type on the front and rear sides or with predetermined spacing. A sample was prepared by evaporating an Ni electrode having a diameter of 2 millimeters on a silicon carbide single crystal that was determined to be of an n type. Since the area of each of the electrodes was large, an electric resistivity value was calculated from current-voltage properties which were measured by direct energization, an electrode area, and a distance between electrodes, regardless of rectification. In this manner, an electric resistivity value and a temperature dependence of the electric resistivity value were measured.

First, a silicon carbide single crystal highly purified was examined. The silicon carbide single crystal highly purified was determined to be of an n type at room temperature, and the concentration of nitrogen measured by SIMS was $1 \times 10^{16}/cm^3$. An electric resistivity value was 5000 to 10000 Ω·cm at room temperature, and the electric resistivity value decreased with an increase in temperature.

The silicon carbide single crystal does not easily prevent nitrogen from being mixed thereinto in its production method, as described above. Even in a highly purified substrate, a small amount of nitrogen functions as a donor. In the silicon carbide single crystal as an impurity semiconductor in which nitrogen is dominant, the activation rate of the donor increases with an increase in temperature, and carriers exponentially increase up to a saturation region. As a result, a phenomenon that an electric resistivity decreases may be observed.

Figure 1:
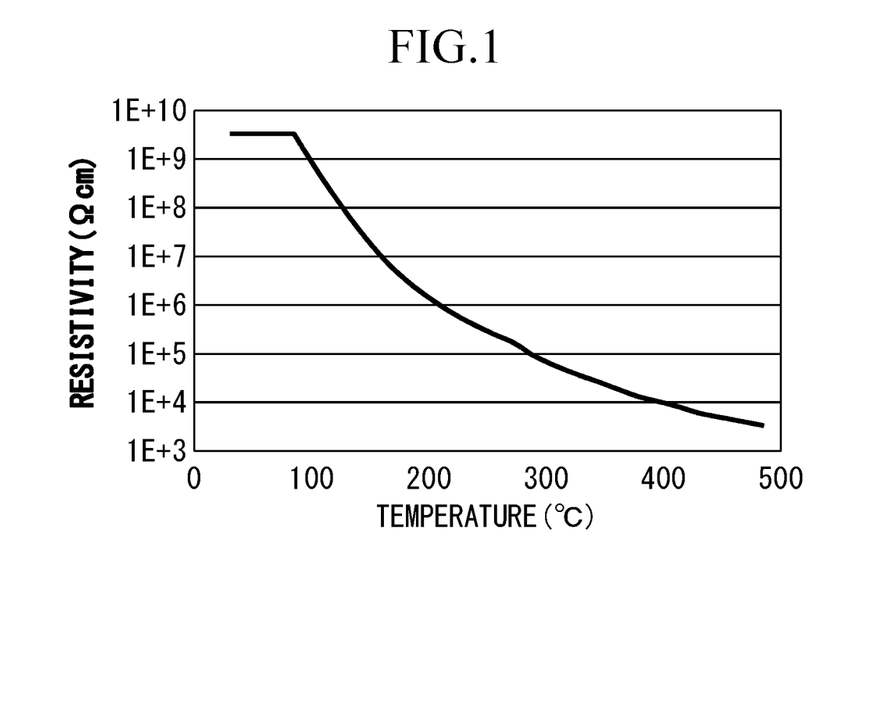
FIG. 1 is a diagram illustrating temperature dependence properties of the electric resistivity of the silicon carbide single crystal into which V is doped.

Then, a silicon carbide single crystal into which V is doped was examined. FIG. 1 is a diagram illustrating temperature dependence properties of the electric resistivity of the silicon carbide single crystal into which V (vanadium) is doped. The electric resistivity was significantly high at ordinary temperature and exceeded a measurement limit. Thus, p/n determination was not performed. The concentration of nitrogen measured by SIMS was $3 \times 10^{16}/cm^3$.

In FIG. 1, an electric resistivity at 80° C. or less is a uniform value ($2 \times 10^9$ Ω·cm). However, this is because $2 \times 10^9$ Ω·cm is an upper limit of an electric resistivity that can be calculated from respective limitations of a measurement unit and a prepared sample used in the current measurement. It is estimated that an electric resistivity at ordinary temperature is $1 \times 10^{12}$ Ω·cm or more from extrapolation by an Arrhenius plot of a measurement value obtained in a temperature range exceeding 80° C. Thus, an electric resistivity at actual room temperature may be at least $2 \times 10^9$ Ω·cm or more.

However, a phenomenon that the electric resistivity of the silicon carbide single crystal into which V is doped dramatically decreases by five digits or more to $1 \times 10^8$ Ω·cm at 130° C. or to $1 \times 10^4$ Ω·cm at 400° C. with an increase in temperature is observed.

Accordingly, the decrease in the electric resistivity with the increase in temperature in the silicon carbide single crystal into which V is doped may be because electrons captured by V at room temperature change to a state where an emission time period from V significantly decreases with an increase in temperature so that a capture function is not apparently exerted and electrons as carriers increase.

Figure 2:
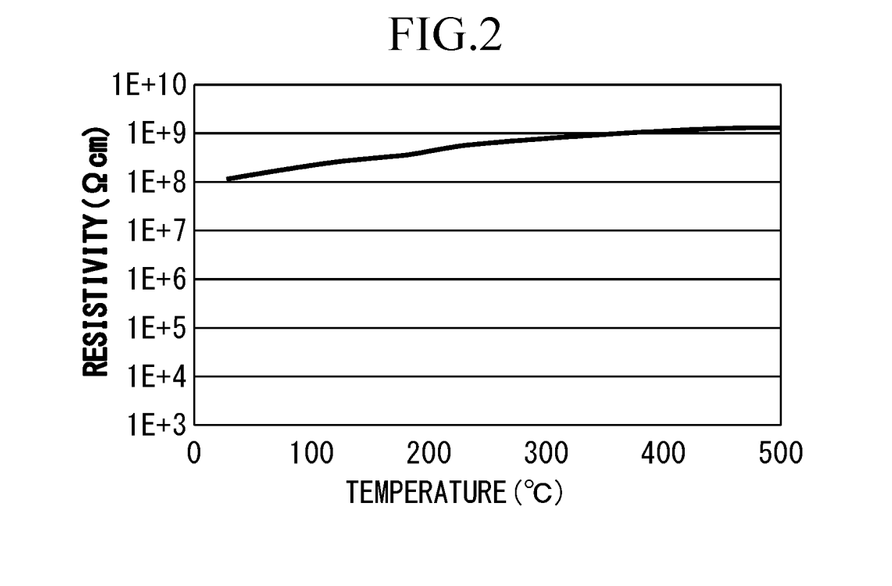
FIG. 2 is a diagram illustrating temperature dependence properties of the electric resistivity of the silicon carbide single crystal according to the embodiment.

Then, the silicon carbide single crystal according to the embodiment was examined. FIG. 2 is a diagram illustrating temperature dependence properties of the electric resistivity of the silicon carbide single crystal according to the embodiment. The concentration of nitrogen obtained by SIMS analysis was $7 \times 10^{15}/cm^3$, and the concentration of boron was $2 \times 10^{16}/cm^3$. In the measurement, a sample prepared by confirming hole conduction of the silicon carbide single crystal and evaporating a TiAl electrode having a diameter of 2 millimeters as a p-type ohmic was used. The silicon carbide single crystal exhibited an electric resistivity of approximately $1 \times 10^8$ Ω·cm at room temperature. This value was a low value as compared with the electric resistivity (at least $2 \times 10^9$ Ω·cm or more) at room temperature of the silicon carbide single crystal into which V is added, previously illustrated. However, in the silicon carbide single crystal according to the embodiment, a specific resistance tended to increase with an increase in temperature in a range from room temperature to 400° C., as illustrated in FIG. 2. That is, the temperature and the electric resistivity have a positive correlation in the range from room temperature to 400° C. As a result, at a temperature of 110° C. or more, the silicon carbide single crystal according to the embodiment has an electric resistivity exceeding that of the silicon carbide single crystal into which V is doped.

This phenomenon may be because an increase in the activation rate of a donor is greater than an increase in the activation rate of an acceptor with an increase in temperature so that electrons excited from the donor compensates for holes as carriers that have so far dominated electric conduction and carriers effective for electric conduction effectively decreases.

That is, the substrate is of a mere p⁻type only by making electric conduction by holes dominant. However, in the present embodiment, holes are compensated for by a donor dopant having a concentration low enough for electric conduction properties by electrons not to be seen at ordinary temperature. An example of the concentration of nitrogen as the donor dopant is $1 \times 10^{15}/cm^3$ to $5 \times 10^{16}/cm^3$, as described above. As a result, an activated donor is compensated for by an acceptor when the temperature increases in a range from room temperature to 400° C. Thus, there can be provided a silicon carbide single crystal that holds an electric resistivity of $1 \times 10^7$ Ω·cm or more.

At this time, the concentration of a transition element contained in the silicon carbide single crystal can be any concentration in a range in which the transition element itself does not emit carriers contributing to electric conduction in the range from room temperature to 400° C. However, in a case where the silicon carbide single crystal exhibits hole conduction properties, for example, when the transition element compensates for electrons having a high concentration, an electric resistivity dramatically decreases with an increase in temperature. When the concentration of the transition element is set to $1 \times 10^{17}/cm^3$ or less or more preferably set to $1 \times 10^{16}/cm^3$ or less, as described above, the transition element can be prevented from forming a deep trap, capturing electrons and holes that have increased by an increase in activation rate with an increase in temperature, and promoting an increase of either the electrons or the holes as carriers.

The polytype of the silicon carbide single crystal can be a 3C, 4H, 6H, or 15R polytype. The silicon carbide single crystal according to the embodiment positively permits hole conduction at room temperature. Thus, the 6H polytype having lower hole mobility than that of the 4H polytype, for example, can be adopted. If a wide band gap is required in an application to a device, not the 3C polytype but the 4H or 6H polytype can be adopted.

A semiconductor apparatus can be provided by preparing a substrate containing the silicon carbide single crystal according to the above-described embodiment and forming a device on the substrate. As the device to be formed on the substrate, a metal-semiconductor field effect transistor (MESFET), a metal-oxide-semiconductor field-effect transistor (MOSFET), or a high electron mobility transistor (HEMT), for example, can be adopted. Such a semiconductor apparatus can be one assuming an operation at 200° C.or more, for example.

Figure 3:
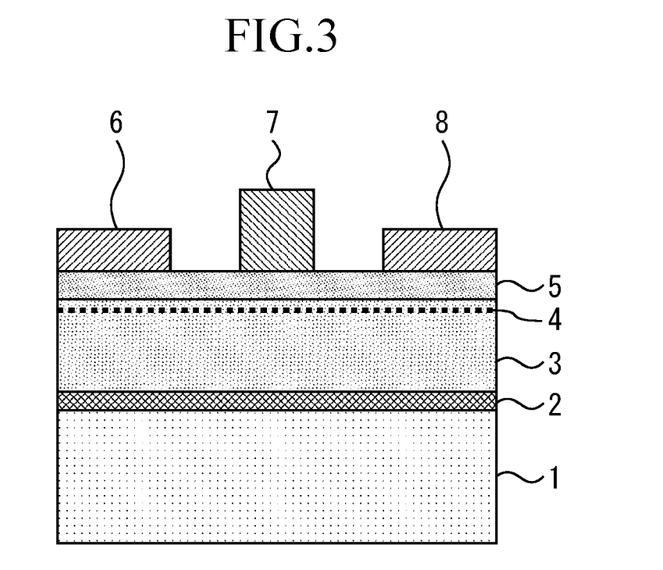
FIG. 3 is a cross-sectional view of a semiconductor apparatus.

FIG. 3 is a cross-sectional view of a semiconductor apparatus. The semiconductor apparatus includes a substrate 1 using the silicon carbide single crystal according to the embodiment as a material. A plurality of compound semiconductor layers are laminated on the substrate 1. Specifically, the semiconductor apparatus includes a lower buffer layer 2 formed on the substrate 1, a buffer layer 3 formed on the lower buffer layer 2, and a Schottky layer 5 formed on the buffer layer 3.

The lower buffer layer 2 may also be referred to as a low-temperature buffer layer because it includes MN or GaN formed at low temperature. The buffer layer 3 is formed of GaN into which carbon, for example, is doped. The Schottky layer 5 is formed of AlGaN, for example. The lower buffer layer 2, the buffer layer 3, the Schottky layer 5 are laminated in this order on the substrate 1, to form a heterojunction structure. A gate electrode 7, a source electrode 6, and a drain electrode 8 are formed on the Schottky layer 5. The source electrode 6 and the drain electrode 8 as an ohmic electrode are formed by laminating AlTi and Au in this order on the Schottky layer 5. The gate electrode 7 as a Schottky electrode is formed by laminating Pt and Au in this order on the Schottky layer 5. FIG. 3 also illustrates that two-dimensional electron gas 4 is formed directly below a heterojunction interface between the Schottky layer 5 and the buffer layer 3.

Figure 4:
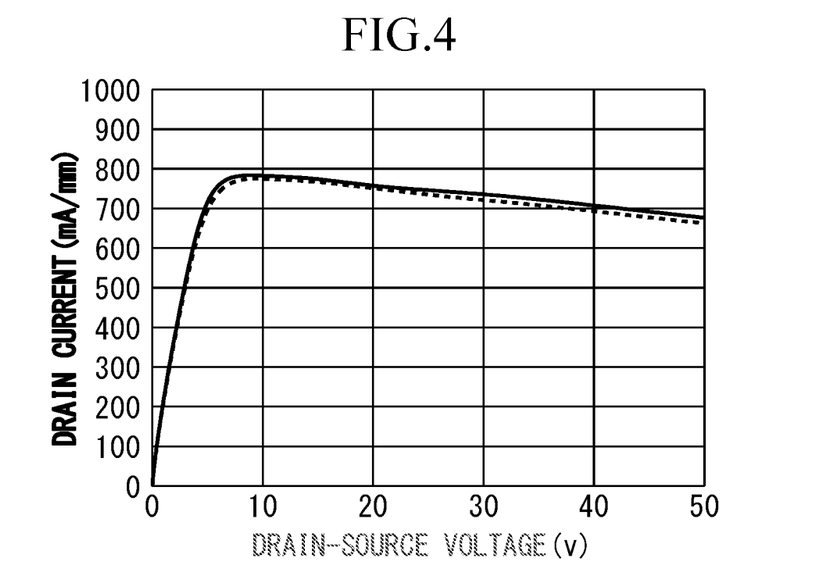
FIG. 4 is a diagram illustrating current-voltage properties of GaN-HEMTs obtained when ambient temperature is ordinary temperature.
Figure 5:
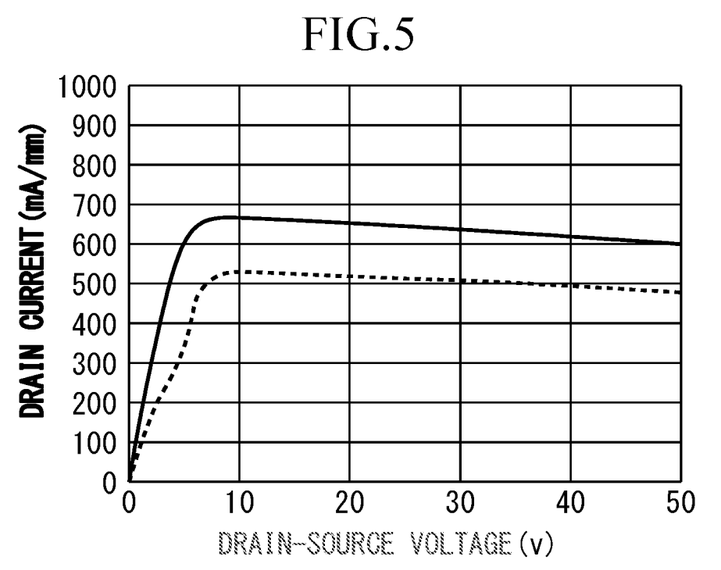
FIG. 5 is a diagram illustrating voltage-current properties of GaN-HEMTs obtained when ambient temperature is 250° C.

FIGS. 4 and 5 are diagrams each illustrating respective voltage-current properties of a GaN-HEMT produced on the silicon carbide single crystal according to the embodiment and a GaN-HEMT produced on a substrate of a silicon carbide single crystal to which V is added at a concentration of $8 \times 10^{16}/cm^3$. In FIGS. 4 and 5, a solid line illustrates the voltage-current properties of the GaN-HEMT produced on the silicon carbide single crystal according to the embodiment, and a broken line illustrates the voltage-current properties of the GaN-HEMT produced on the substrate of the silicon carbide single crystal to which V is added. Both GaN-HEMTs are the same in transistor structure.

FIG. 4 illustrates the current-voltage properties of the GaN-HEMT obtained when ambient temperature is ordinary temperature, and FIG. 5 illustrates the voltage-current properties of the GaN-HEMT obtained when ambient temperature is 250° C. In measurement, a gate voltage is set to 4 V, and an operation frequency is set to 1 MHz. FIG. 4 illustrates the respective voltage-current properties in a case where ambient temperature is ordinary temperature of the GaN-HEMT produced on the silicon carbide single crystal according to the embodiment and the GaN-HEMT produced on the substrate of the silicon carbide single crystal to which V is added. There is almost no difference therebetween. It is confirmed from FIG. 4 that the electric resistivity of the silicon carbide single crystal according to the embodiment does not affect the properties of the GaN-HEMT at ordinary temperature, although below the electric resistivity of the silicon carbide single crystal to which V is added at a temperature of 110° C. or less, as described above.

FIG. 5 is a diagram illustrating respective voltage-current properties in a case where ambient temperature is set to 250° C. of the GaN-HEMT produced on the silicon carbide single crystal according to the embodiment and the GaN-HEMT produced on the substrate of the silicon carbide single crystal to which V is added.

As can be seen from comparison between FIG. 4 and FIG. 5, in the GaN-HEMT produced on the substrate of the silicon carbide single crystal to which V is added, a current greatly decreases by an increase in ambient temperature. On the other hand, in the GaN-HEMT produced on the silicon carbide single crystal according to the embodiment, a decrease of a current with an increase in ambient temperature is slight. That is, a decrease of an output power of a transistor at high temperature can be restrained. This phenomenon may be because the electric resistivity of the substrate of the silicon carbide single crystal is maintained even at high temperature in the GaN-HEMT produced on the silicon carbide single crystal according to the embodiment, while an emission time period of electrons captured by V decreases at high temperature so that the electric resistivity of the substrate decreases and high frequency properties decrease in the GaN-HEMT using the substrate of the silicon carbide single crystal to which V is added.

Figure 6:
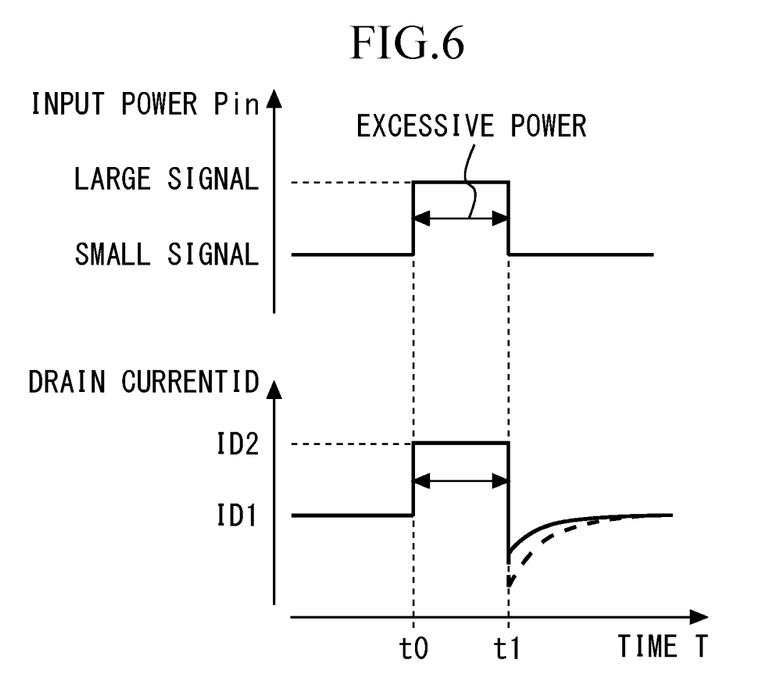
FIG. 6 is an explanatory view illustrating recovery properties of a transistor.

FIG. 6 is an explanatory view illustrating recovery properties of a transistor. In FIG. 6, an upper stage illustrates an input power Pin to be inputted to the transistor, and a lower stage schematically illustrates a drain current ID of the transistor. A horizontal axis illustrated in FIG. 6 represents time T in both the upper and lower stages. As illustrated in the upper stage of FIG. 6, the magnitude of a signal to be inputted to the transistor is a level of a small signal up to time T=t0, and is raised to a level of a large signal from time t0 to time t1 and is lowered to the level of the small signal again after time t1. The level of the large signal is a level as an excessive input to the transistor. As illustrated in the lower stage of FIG. 6, a drain current of the transistor is ID1 before time t0 and is ID2 from time t0 to time t1 depending on the input power. However, a drain current immediately after time t1 when the input power is lowered from the large signal to the small signal is ID1 or less once after the drain current decreases due to an effect of a trap of gallium nitride (GaN) (a lattice loss of a semiconductor), and is gradually recovered to ID1 transiently with a time constant. Generally, this phenomenon is referred to as recovery properties.

Figure 7:
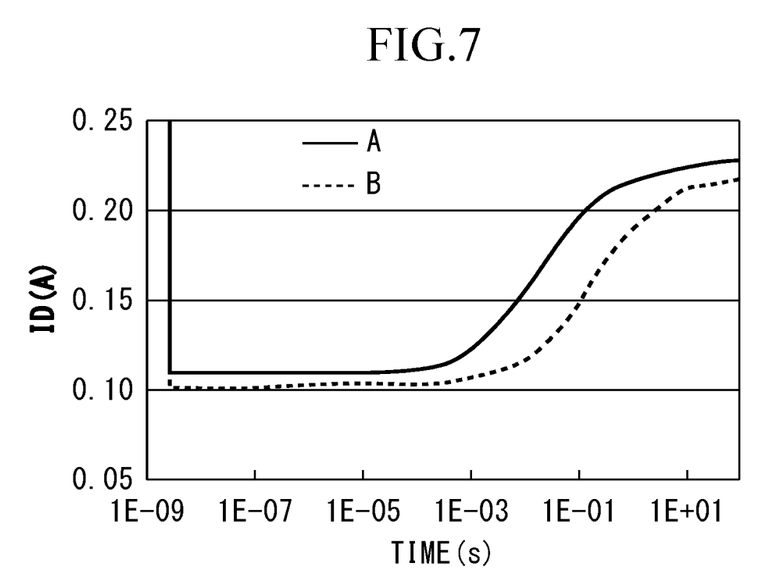
FIG. 7 is a diagram of current-time properties illustrating of recovery properties of GaN-HEMTs.

FIG. 7 is a diagram illustrating respective recovery properties of the GaN-HEMT produced on the substrate of the silicon carbide single crystal according to the embodiment and the GaN-HEMT produced on the substrate of the silicon carbide single crystal to which V is added, illustrating comparison between respective behaviors of a drain current after T=t1 in FIG. 6. Current-time properties of the GaN-HEMT produced on the substrate of the silicon carbide single crystal according to the embodiment are indicated by a solid line, and current-time properties of the GaN-HEMT produced on the substrate of the silicon carbide single crystal to which V is added are indicated by a broken line.

As illustrated in FIG. 7, a decrease of the current flowing through the GaN-HEMT produced on the substrate of the silicon carbide single crystal according to the embodiment is small as compared with a decrease of the current flowing through the GaN-HEMT produced on the substrate of the silicon carbide single crystal to which V is added. That is, a change of properties of the transistor is restrained. This may be because an effective amount of vanadium does not exist, i.e., electrons are neither captured nor emitted by vanadium so that a decrease of a drain current Id becomes small and the recovery properties are improved in the silicon carbide single crystal according to the embodiment.

The substrate of the silicon carbide single crystal according to the embodiment can be appropriately used for a field effect transistor that operates at a high frequency including a microwave and a millimeter wave and particularly a high electron mobility transistor.

REFERENCE SIGNS LIST 1 substrate, 2 lower buffer layer, 3 buffer layer, 4 two-dimensional electron gas, 5 Schottky layer, 6 source electrode, 7 gate electrode, 8 drain electrode

The invention claimed is:

1. A silicon carbide single crystal
having a positive correlation between a temperature and an electric resistivity across an entire range from room temperature to 400° C.,
having an electric resistivity of at least $1\times10^7$ Ω·cm in a range from room temperature to 400° C.,
exhibiting electric conduction by holes at room temperature, and
having a concentration of a transition element of $1\times10^{17}/cm^3$ or less.

2. The silicon carbide single crystal according to claim 1, comprising
at least one type of donor dopant, and
at least one type of acceptor dopant,
wherein the electric resistivity is increased by a decrease in the number of carriers contributing to electric conduction with an increase in temperature in the range from room temperature to 400° C.

3. The silicon carbide single crystal according to claim 2, wherein the donor dopant is nitrogen having a concentration of less than $1\times10^{17}/cm^3$.

4. The silicon carbide single crystal according to claim 2, wherein the acceptor dopant is boron or aluminum having a concentration of $1\times10^{17}/cm^3$ or less.

5. The silicon carbide single crystal according to claim 1, wherein a concentration of vanadium is less than $1\times10^{17}/cm^3$.

6. The silicon carbide single crystal according to claim 1, wherein an activated donor is compensated for by an acceptor when the temperature increases in the range from room temperature to 400° C., to hold an electric resistivity of $1\times10^7$ Ω·cm or more.

7. The silicon carbide single crystal according to claim 1, wherein a polytype of the silicon carbide single crystal is a 3C, 4II, 6II, or 15R polytype.

8. The silicon carbide single crystal according to claim 2, wherein the donor dopant is nitrogen having a concentration of $5\times10^{16}/cm^3$ or less.

9. The silicon carbide single crystal according to claim 1, having an electric resistivity of at least $1\times10^8$ Ω·cm at room temperature.

10. The silicon carbide single crystal according to claim 2, wherein a concentration of the acceptor dopant is in a range of not less than $5\times10^{15}/cm^3$ nor more than $3\times10^{16}/cm^3$.

11. The silicon carbide single crystal according to claim 10, wherein a concentration of the donor dopant is in a range that is not less than one-tenth nor more than four-tenths of the concentration of the acceptor dopant.

12. The silicon carbide single crystal according to claim 11, wherein the acceptor dopant is boron or aluminum, and the donor dopant is nitrogen.

13. The silicon carbide single crystal according to claim 1, which does not contain an effective amount of vanadium for trapping or releasing electrons.

14. The silicon carbide single crystal according to claim 2, wherein a concentration of the acceptor dopant is in a range of not less than $2\times10^{15}/cm^3$.

15. The silicon carbide single crystal according to claim 1, wherein the silicon carbide single crystal is P type.

16. The silicon carbide single crystal according to claim 1, wherein the electric resistivity is controlled by a donor and an acceptor.

17. The silicon carbide single crystal according to claim 1, wherein an amount of the transition element is in a range in which the transition element itself does not emit carriers contributing to electric conduction in the range from room temperature to 400° C.

18. A semiconductor apparatus comprising:
a substrate including a silicon carbide single crystal having a positive correlation between a temperature and an electric resistivity across an entire range from room temperature to 400° C., having an electric resistivity of at least $1\times10^7$ Ω·cm in the range from room temperature to 400° C., exhibiting electric conduction by holes at room temperature, and having a concentration of a transition element of $1\times10^{17}/cm^3$ or less; and
a device formed on the substrate.

19. The semiconductor apparatus according to claim 18, wherein the device is a metal-semiconductor field effect transistor, a metal-oxide-semiconductor field effect transistor, or a high electron mobility transistor.

20. The semiconductor apparatus according to claim 18, wherein the device formed on the substrate operates_at 200° C. or more.

21. The silicon carbide single crystal according to claim 18, which does not contain an effective amount of vanadium for trapping or releasing electrons.

22. The semiconductor apparatus according to claim 18, wherein an amount of the transition element is in a range in which the transition element itself does not emit carriers contributing to electric conduction in the range from room temperature to 400° C.

* * * * *